United States Patent
Franken et al.

(10) Patent No.: US 8,308,867 B2
(45) Date of Patent: *Nov. 13, 2012

(54) DEVICE FOR THE TEMPERATURE CONTROL OF THE SURFACE TEMPERATURES OF SUBSTRATES IN A CVD REACTOR

(75) Inventors: Walter Franken, Eschweiler (DE); Johannes Käppeler, Würselen (DE)

(73) Assignee: Aixtron Inc., Sunnyvale, CA (US)

( * ) Notice: Subject to any disclaimer, the term of this patent is extended or adjusted under 35 U.S.C. 154(b) by 360 days.

This patent is subject to a terminal disclaimer.

(21) Appl. No.: 12/603,000

(22) PCT Filed: Jun. 3, 2008

(86) PCT No.: PCT/EP2008/056847
§ 371 (c)(1),
(2), (4) Date: Dec. 3, 2009

(87) PCT Pub. No.: WO2008/148759
PCT Pub. Date: Dec. 11, 2008

(65) Prior Publication Data
US 2010/0170435 A1    Jul. 8, 2010

(30) Foreign Application Priority Data
Jun. 6, 2007 (DE) .......................... 10 2007 026 348

(51) Int. Cl.
*C23C 16/46* (2006.01)
*C23C 16/455* (2006.01)

(52) U.S. Cl. ........................................ 118/730; 118/666
(58) Field of Classification Search .................. 118/730, 118/666
See application file for complete search history.

(56) References Cited

U.S. PATENT DOCUMENTS

| | | | | |
|---|---|---|---|---|
| 4,858,556 | A * | 8/1989 | Siebert | 118/664 |
| 4,860,687 | A * | 8/1989 | Frijlink | 118/500 |
| 5,177,878 | A | 1/1993 | Visser | |
| 7,067,012 | B2 * | 6/2006 | Jurgensen et al. | 118/730 |

(Continued)

FOREIGN PATENT DOCUMENTS
DE     10043600     3/2002
(Continued)

OTHER PUBLICATIONS

AIXTRON AG, PCT/EP2008/056847 filed Jun. 3, 2009; International Search Report and Written Opinion; ISA/EP; Sep. 29, 2008; 10pp.

*Primary Examiner* — Sylvia R. MacArthur
(74) *Attorney, Agent, or Firm* — Tarek N. Fahmi, APC

(57) ABSTRACT

The invention relates to a CVD reactor having a plurality of rotary tables (2) supported on a rotationally driven susceptor (1) on dynamic gas cushions (3), wherein each gas cushion (3) is formed by an individually controlled gas flow and each gas flow, dependant on a surface temperature measured by a temperature measuring device (4), can be varied by an individual actuator (5). The invention further comprises a carrier (6), carrying the susceptor (1) and rotating with the susceptor (1). A common gas supply line (7) ending in the carrier (6) is key to the invention and provides the actuators (5) arranged on the carrier (6) with the gas that forms the gas flow.

12 Claims, 6 Drawing Sheets

U.S. PATENT DOCUMENTS

Figure 1:
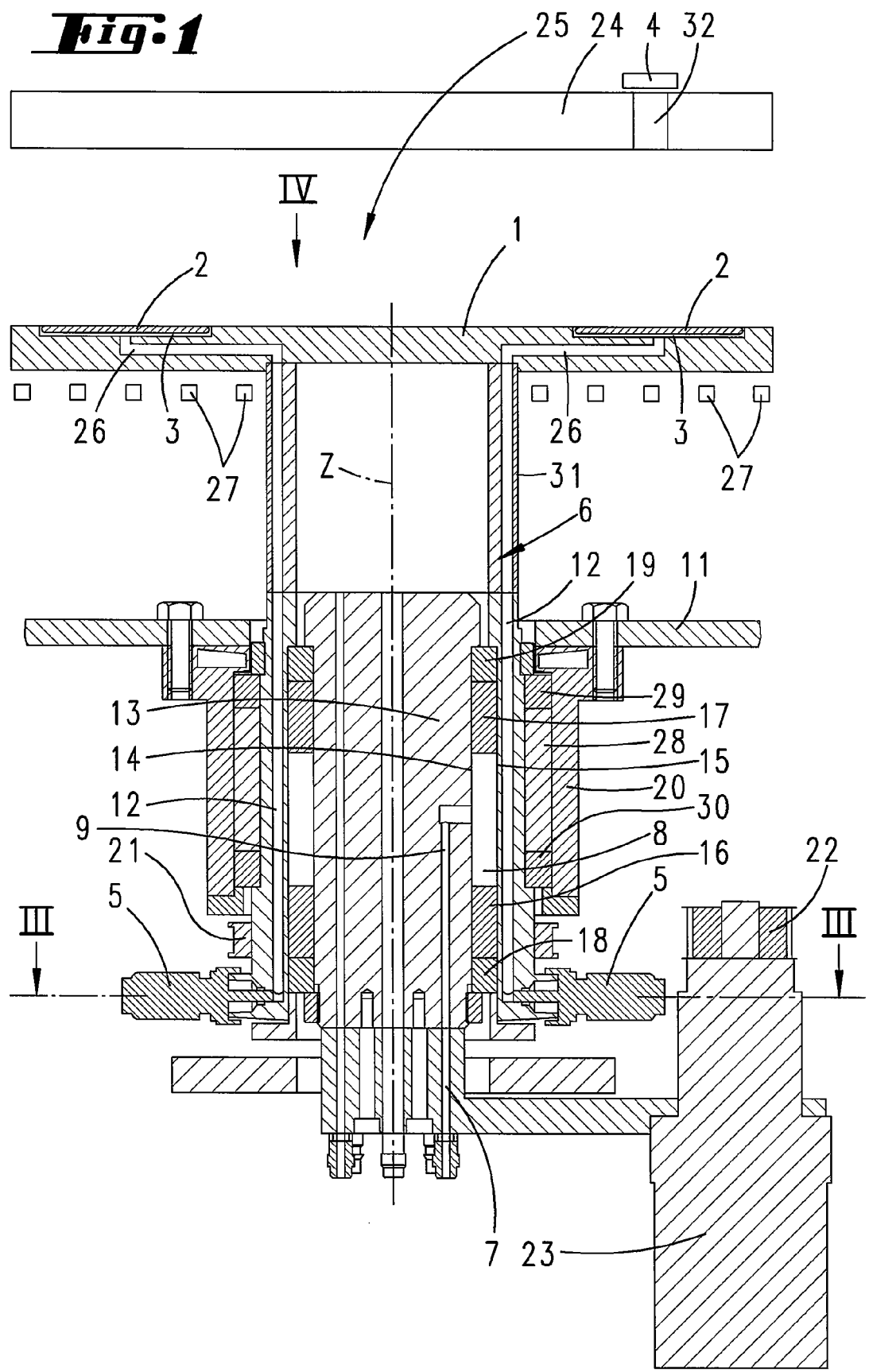

| | | | |
|---|---|---|---|
| 2004/0231599 A1* | 11/2004 | Schwambera et al. | 118/728 |
| 2006/0201427 A1* | 9/2006 | Jurgensen et al. | 118/715 |
| 2006/0222481 A1 | 10/2006 | Foree | |
| 2007/0015374 A1 | 1/2007 | Granneman | |
| 2008/0251020 A1* | 10/2008 | Franken et al. | 118/730 |
| 2008/0257537 A1* | 10/2008 | Hatta et al. | 165/263 |
| 2009/0110805 A1* | 4/2009 | Kaeppeler et al. | 427/8 |
| 2010/0170435 A1* | 7/2010 | Franken et al. | 118/666 |

FOREIGN PATENT DOCUMENTS

| | | |
|---|---|---|
| DE | 100 56 029 | 5/2002 |
| DE | 10133914 | 1/2003 |
| DE | 10323085 | 12/2004 |
| DE | 10 2006 018514 | 10/2007 |
| EP | 0242898 | 10/1987 |
| EP | 1 335 997 | 8/2003 |
| WO | 02/38840 A | 5/2002 |

* cited by examiner

DEVICE FOR THE TEMPERATURE CONTROL OF THE SURFACE TEMPERATURES OF SUBSTRATES IN A CVD REACTOR

CROSS REFERENCES TO RELATED APPLICATIONS

The present patent application is a National Stage under 35 USC 365 and claims priority to PCT International Application No. PCT/EP2008/056847 filed Jun. 3, 2008, incorporated herein by reference, which claims priority benefit from DE Application No.: 102007026348.3 filed Jun. 6, 2007.

The invention relates to a CVD reactor with a multiplicity of rotary tables carried on dynamic gas cushions on a rotationally driven susceptor, each gas cushion being formed by an individually controlled gas flow and each gas flow being variable by means of an individual control element according to a surface temperature measured by a temperature measuring device.

DE 100 56 029 A1 and EP 1 335 997 B1 describe a CVD reactor of this kind. The device described there is provided with a susceptor substantially in the form of a circular disk, which has, on its surface lying in a horizontal plane, a multiplicity of recesses, in each of which there lies a rotary table on which one or more substrates can be placed, which substrates can be coated with a layer, in particular a semiconductor layer, in a process chamber, the layer-forming material being introduced into the process chamber in a gaseous form through a gas inlet element. The rotary tables are borne on individual gas cushions, the gas being introduced into the intermediate space between the underside of the rotary tables and the bottom of the recess in such a way that the rotary tables rotate. Underneath the susceptor there is a heater, which heats up the susceptor from below. The individual rotary tables are thereby likewise heated up by means of thermal conduction and thermal radiation. The surface temperatures of the rotary tables or the surface temperatures of the substrates lying on the rotary tables are monitored by means of temperature measuring elements. The surface temperatures can be individually varied by varying the height of the gas cushion by increasing or reducing the gas flow forming the respective gas cushion. As a result, the heat transfer through the gap between the rotary table and the bottom of the recess is changed.

The method described by EP 1 335 997 B1 relates to temperature control by variation of the height of the gas cushion. The gas flows are set by gas mass flow control devices.

DE 10 2006 018 514 A1 describes a device for controlling the surface temperature of a substrate in a process chamber. There, it is not the height of the gas cushion that is varied but the composition of the gas, which consists of a gas mixture. One of the gases has a high thermal conductivity. Another gas has a lower thermal conductivity.

DE 103 23 085 A1 discloses a CVD coating device in which a carrier rotatably disposed in the reactor housing carries a multiplicity of susceptors for respectively receiving a substrate.

DE 101 33 914 A1 discloses a process chamber with a floor which is rotationally driven differently in different portions thereof. A common gas supply line opens out into a system of gas channels of the susceptor. A division takes place there, creating a number of bearing chambers in which the substrate holder respectively lies, carried by a gas film.

DE 100 43 600 A1 discloses a coating device with a carrier rotatably disposed in a reactor housing, the carrier carrying a multiplicity of receiving chambers which are disposed in a satellite-like manner around the center of rotation of the carrier and in each of which a substrate holder lies.

EP 0 242 898 B1 describes a susceptor in a CVD reactor, the substrates rotating during the coating.

In the case of the generic device mentioned at the beginning, an individual supply line into the reactor housing from outside is required for each rotary table, since the control elements formed there by gas mass flow control devices are associated with a fixed gas mixing system. If it is intended in the case of the generic device that the susceptor should also be rotated about its axis in addition to the rotary tables, a complicated gas supply line is required, since a multiplicity of fixed supply lines lying outside the reactor must individually correspond to the supply lines rotating along with the susceptor.

It is an object of the invention to improve the generic device advantageously with respect to its use.

The object is achieved by the invention specified in the claims, Claims 2 to 12 being advantageous developments of the CVD reactor specified in Claim 1. It is particularly preferred that each of Claims 2 to 12 is an independent solution for achieving the object and can be combined with any other claim.

First and foremost, it is provided that the control elements rotate along with the susceptor. For this purpose, they are associated with a carrier carrying the susceptor. In a development of the invention, it is provided that a common gas supply line opens out into the carrier. The carrier may in this case have a portion which rotates along with the susceptor and a portion which is fixed with respect to the reactor housing. The common gas supply line is associated with the fixed portion. The common gas supply line may open out into a gas distribution volume, from which individual supply lines branch off to each control element. From each control element there then respectively extends a supply line, which transports the gas flow into a recess in which a rotary table is in each case disposed, each lying on an individual gas cushion formed by the individual gas flow. The control elements are preferably valves. Since the valves rotate along with the susceptor, special activation of the latter is required. This may take place telemetrically or by means of sliding contacts. If a power supply to the control elements is required, this may take place inductively or likewise by means of sliding contacts. The valves preferably maintain their position without power. A pressure controller may be disposed in the supply line to keep the gas pressure in the common supply line constant. The method is distinguished in particular by the fact that the surface temperatures of a number of rotary tables or substrates, disposed substantially in the form of a ring around the center of the susceptor, are measured one after the other by a single temperature measuring element individually associated with the respective ring. In a corresponding way, the gas flows to the associated gas cushions are correspondingly varied one after the other. The variation of the height of the gas cushions consequently takes place at certain definite intervals one after the other, the time between the controlling or regulating events being short in relation to the relatively slow temperature change. The carrier may have a portion which is disposed in the interior of the reactor housing and a portion which is disposed outside the reactor housing. The valves are preferably associated with the portion of the carrier disposed outside the reactor housing, to be precise the rotationally driven portion. The carrier may also have a rotationally fixed portion. This portion has the common supply line. In a preferred development, it is provided that the control elements are grouped in the form of a star around the axis of rotation of the carrier. In a corresponding way, the supply lines are also disposed in the form of a star around the center, that is to say in uniform angular distribution. The carrier may comprise a hollow shaft, on the end edge of which the susceptor lies. A core which has the common gas supply line may be fitted in this hollow shaft. The gas distribution volume may be formed by an annular chamber, the walls of which are formed both by the core and by the supply line. The annular chamber may be located in the bearing gap between the hollow shaft and the core. For mounting the hollow shaft, a bearing housing which is fixedly connected to the reactor housing is provided. The hollow shaft consequently rotates between the core and the bearing housing. Corresponding bearings and sealing elements are provided, in order that gas tightness between the outside and the inside of the reactor is ensured in the region of the mounting of the hollow shaft.

Figure 2:
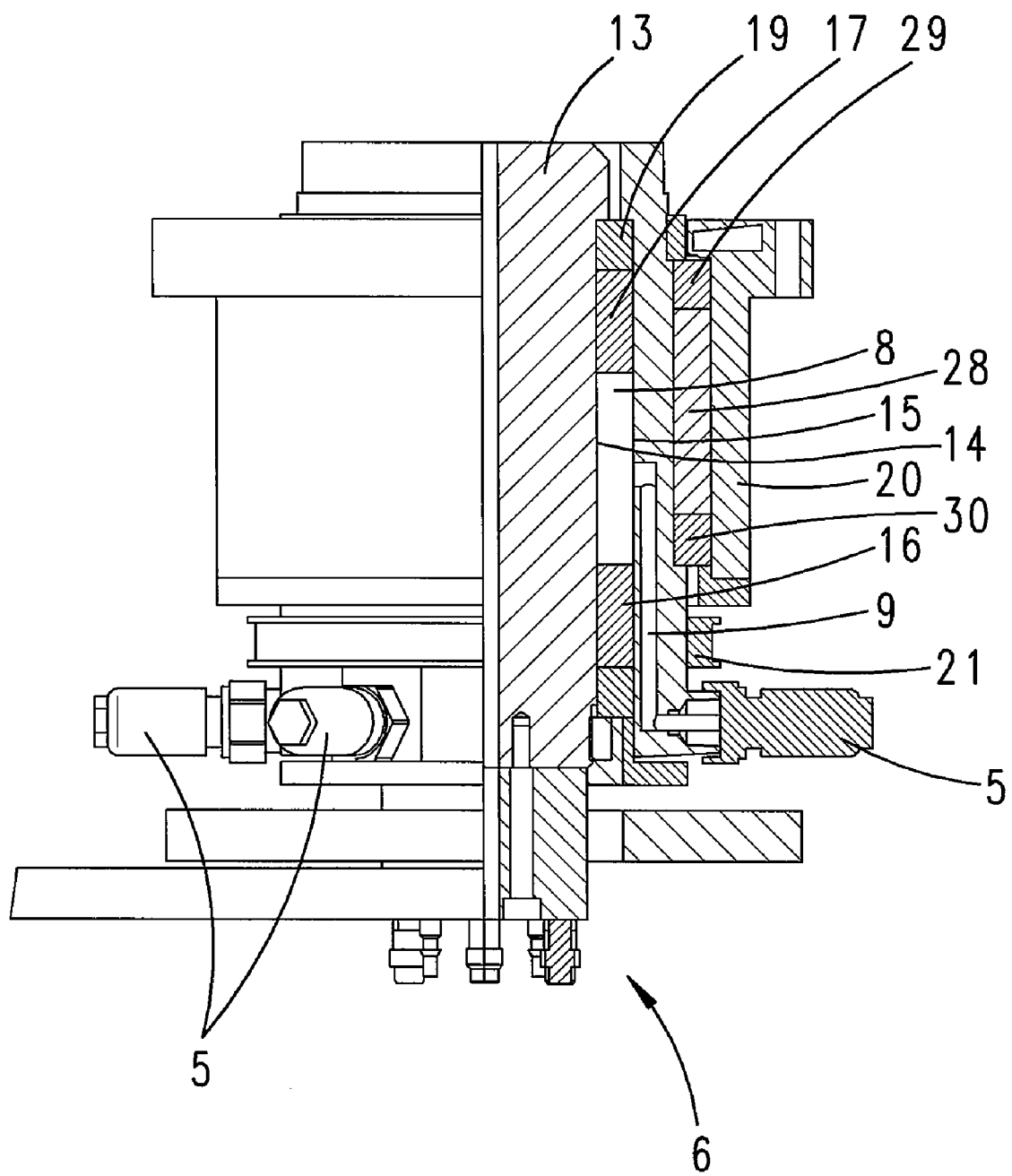
Figure 3:
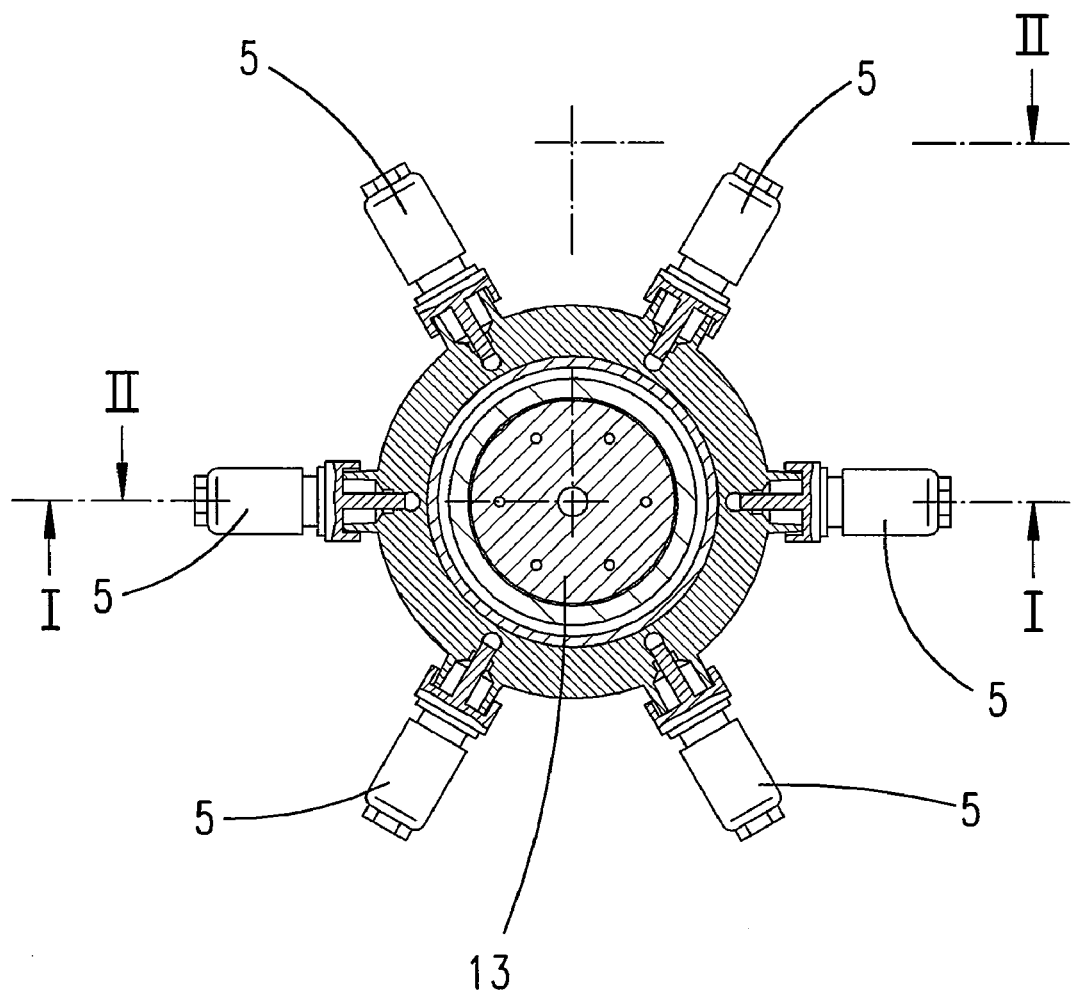
Figure 4:
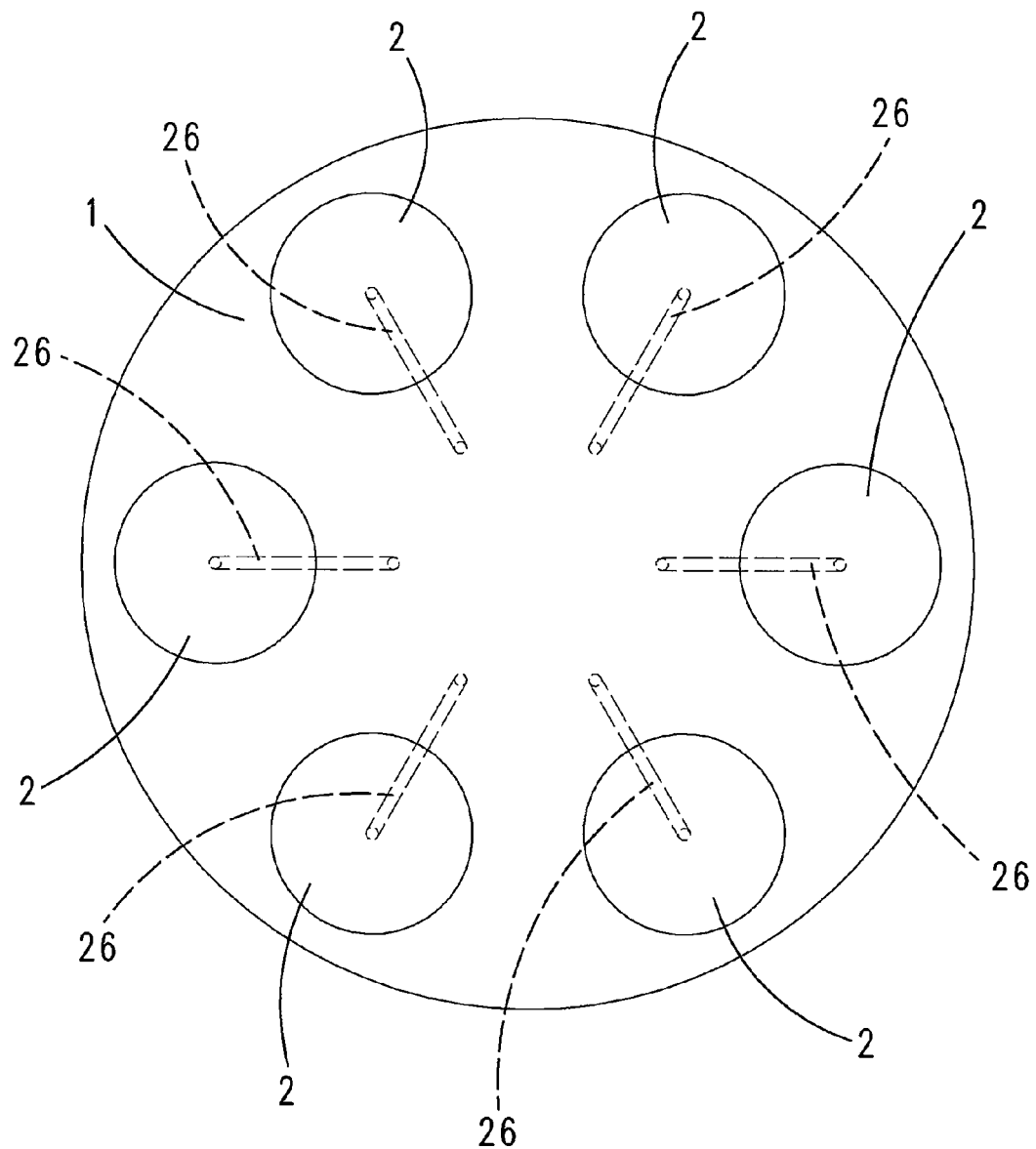
Figure 5:
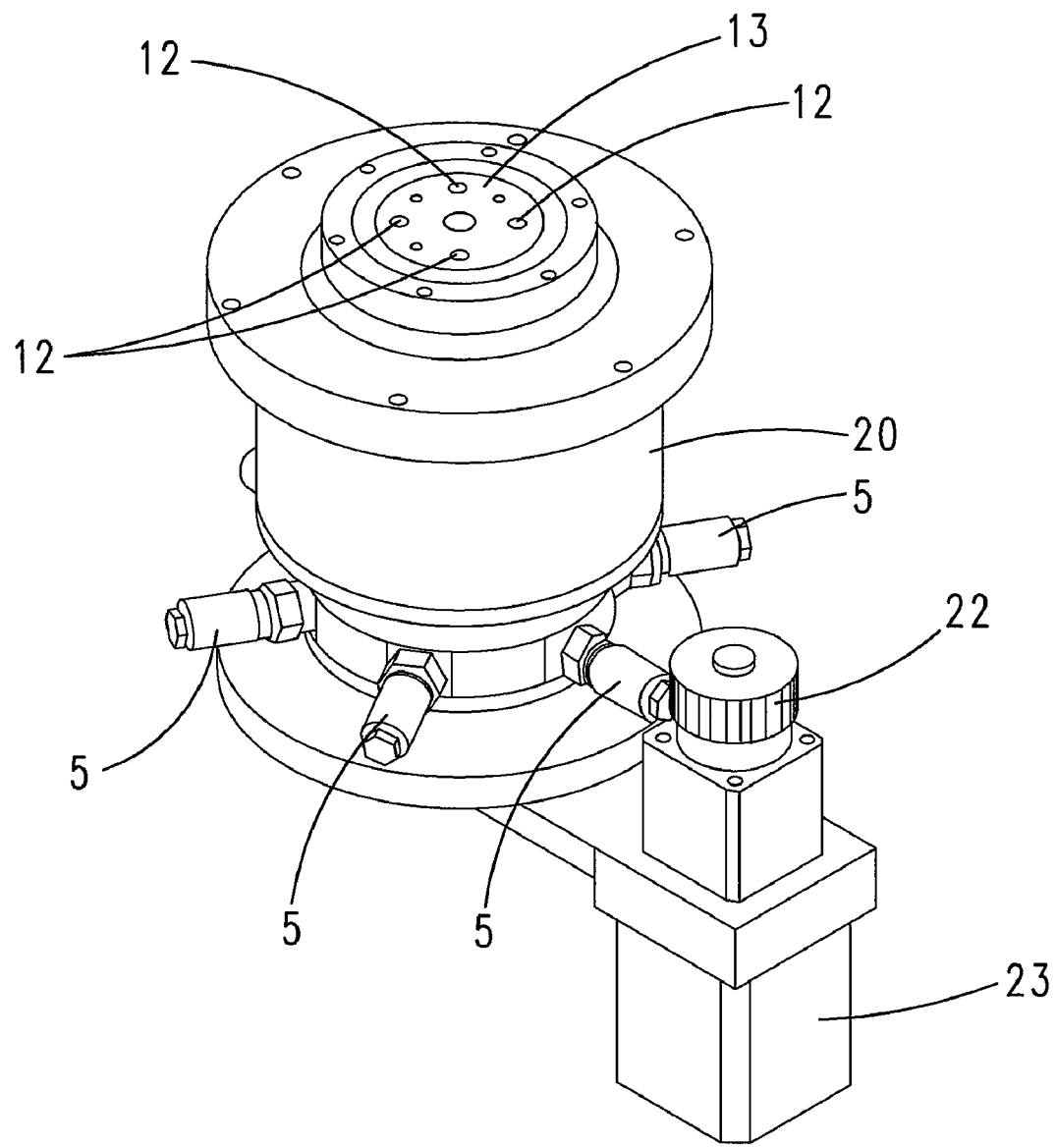
Figure 6:
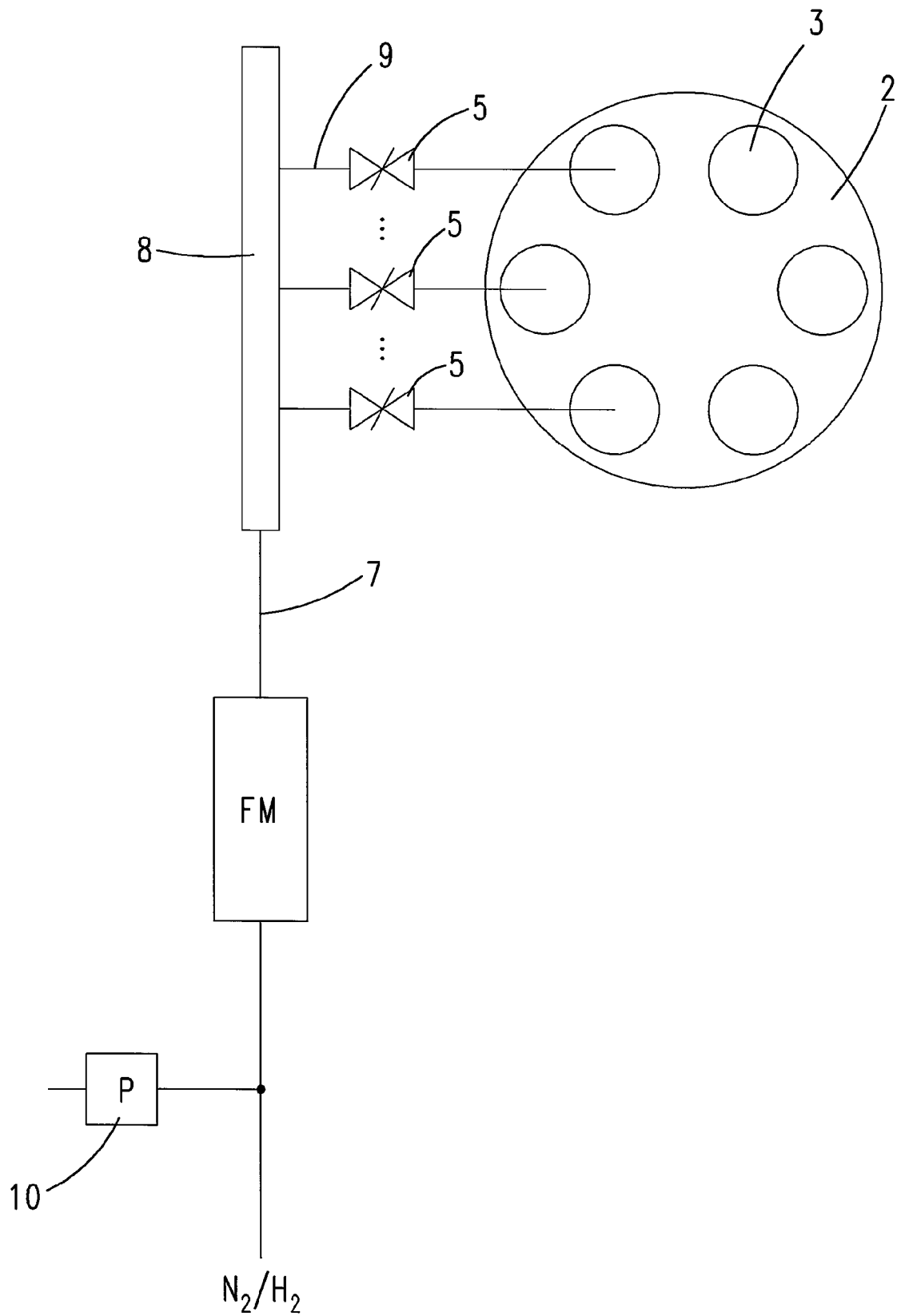

An exemplary embodiment of the invention is explained below on the basis of accompanying drawings, in which:

FIG. 1 shows the parts of a CVD reactor that are essential for explaining the invention, in cross-section according to the line I-I in FIG. 3, FIG. 2 shows the section according to the line II-II in FIG. 3, FIG. 3 shows a section according to the line in FIG. 1, FIG. 4 shows a plan view of the susceptor according to arrow IV, FIG. 5 shows a perspective view of a lower carrier, seated in a bearing housing, along with a drive motor, and FIG. 6 shows a diagrammatic representation of the gas flow.

The CVD reactor has a reactor housing, the lower wall 11 of which is shown in FIG. 1, and which encapsulates the interior of the reactor housing in a gas- and pressure-tight manner with respect to the outside. Inside the reactor housing 11 there is a gas inlet element 24, which has gas outlet openings (not illustrated), which are disposed in a horizontal plane and through which the process gases can flow into a process chamber 25 disposed underneath the gas inlet element 24. The floor of the process chamber 25 is formed by the surface of a susceptor 1. The susceptor consists of graphite and can be rotated about the contour axis Z.

As FIG. 4 and FIG. 1 reveal, the susceptor 1 bears a multiplicity of rotary tables 2, which are formed by graphite elements in the form of circular disks and lie in corresponding recesses in the susceptor 1. An individual supply line 26 opens out into the bottom of each recess, through each of which lines an individual gas flow can be introduced into the gap between the underside of the rotary table 2 and the bottom of the recess. This gas flow forms a gas cushion, on which the rotary table 2 is borne at a spacing from the bottom. The gas flows are introduced into the recess in such a way that a rotation is imparted to the respective rotary table 2.

Above an opening 32 in the gas inlet element 24 there is a temperature sensor 4, for example a pyrometer. The temperature sensor 4 is located directly above the rotary tables 2 at a corresponding radial distance from the center of rotation Z, so that the surface temperature of the rotary table 2 or the surface temperature of one or more substrates lying on the rotary table 2 can be measured by the temperature sensor 4. The surface temperature can be varied by varying the height of the gas cushion 3.

Underneath the susceptor 1 there is a heater 27, which may be a radiant heater or an RF heater. With this heater, first the underside of the susceptor 1 is heated up. The heat is transferred to the gas cushion substantially by thermal conduction and then transferred through the gap formed by the gas cushion 3 to the rotary table 2, likewise by thermal conduction or thermal radiation. The heat transfer can be influenced by the height of the gas cushion 3.

The height of the gas cushion 3 is determined by the amount of gas flow flowing through the respective supply line 26. This gas flow is set by a valve 5. The setting of the valve 5 is effected according to the temperature measured by the temperature sensor 4. The valve 5 is preferably a valve which maintains its position even without power. It may maintain its position by means of sliding contacts (not illustrated) or telemetrically by radio. The valve 5 is adjusted whenever the surface temperature of the associated rotary table 2 has been measured by the temperature sensor 4 and a change in the temperature is required.

The susceptor 1 rests on a carrier 6. The carrier 6 has a hollow shaft 31, on the end edge of which the susceptor 1 lies. Gas supply lines 12, which are disposed in uniform circumferential distribution around the center Z and conduct the carrier gas forming the gas cushion 3, which may be nitrogen or hydrogen, from a valve 5 to channels 26 in the susceptor 1, run inside the hollow shaft 31.

The hollow shaft 31 is mounted in a bearing housing 20, which is fixedly connected to the reactor housing 11. For this purpose, the bearing housing 20 has a bearing cavity, in which a seal 28 is disposed between two rotary bearings 29, 30.

Protruding from the underside of the bearing housing 20 is a portion of the hollow shaft 31, which along with a driven wheel 21 also carries a multiplicity of valves 5. The valves 5 are disposed in uniform circumferential distribution around the center Z, that is to say in the form of a star. Disposed in the hollow shaft 31, parallel to the axially extending gas lines 12, are individual supply lines 9, which conduct the gas from a gas distribution volume 8 to the valve 5.

Inside the hollow shaft 31 there is a core 13, which is connected in a rotationally fixed manner to the reactor housing 11 and carries a drive motor 23, which has a drive wheel 22, with which the driven wheel 21 can be rotated by way of a drive belt (not illustrated). The hollow shaft 31 and the valves 5 carried by it then rotate about the axis of rotation Z and take the susceptor 1 along with them, so that the susceptor 1 can rotate relative to the gas inlet element 24 that is fixed to the housing.

One portion 14 of the outer wall of the core 13 forms an inner wall of the chamber surrounding the core in the form of a ring, which forms the gas distribution volume 8. The outwardly facing wall 15 of the annular chamber 8 is formed by the inner wall of the hollow shaft 31. The two annular upper and lower walls of the gas distribution volume 8 are respectively formed by sealing elements 16, 17, which are disposed above a bearing 18 and below a bearing 19, respectively.

The core 13 has the common supply line 7, which has on the end face of the core 13 a connection to a gas line. The supply line 7 initially runs parallel to the center axis Z. A radial continuation of the supply line 7 opens out into the gas distribution volume 8, thereby forming an opening in the chamber inner wall 14. In the outer chamber wall 15, lying opposite the inner chamber wall 14, are the openings of the individual supply lines 9, through which the gas flowing into the chamber 8 is conducted to the valves 5. The supply lines 9 initially run in a radial direction and subsequently run parallel to the center axis Z.

FIG. 6 reveals that the pressure in the common supply line 7 is kept constant by means of a pressure controller 10. An optional flowmeter FM is additionally provided in the common gas supply line 7. Apart from the nitrogen and hydrogen mentioned, a noble gas or some other usable gas may also be used as the gas for producing the gas cushions 3.

The valves 5 rotating along with the susceptor 1 may be permanently supplied with power. For this purpose, a current supply by way of sliding contacts (not illustrated) may be provided, for example between the core 13 and the hollow shaft 31 or between the housing 20 and the hollow shaft 31. The valves 5 may, however, also be supplied with energy inductively. In addition, the valves may also be supplied with electrical energy only periodically.

All features disclosed are (in themselves) pertinent to the invention. The disclosure content of the associated/accompanying priority documents (copy of the prior patent application) is also hereby incorporated in full in the disclosure of the application, including for the purpose of incorporating features of these documents in claims of the present application.

The invention claimed is:

1. A CVD reactor with a multiplicity of rotary tables carried on dynamic gas cushions (3) on a rotationally driven susceptor (1), each gas cushion being formed by an individually controlled gas flow and each gas flow being variable by means of an individual control element (5) according to a surface temperature measured by a temperature measuring device (4), and with a carrier (6) carrying the susceptor (1) and rotating with the susceptor (1), characterized by a common gas supply line (7), which opens out into the carrier (6) and with which the control elements (5) disposed on the carrier (6) are supplied with a gas forming the gas flow.

2. A CVD reactor according to claim 1, characterized in that the common gas supply line (7) opens out into a gas distribution volume (8), from which individual supply lines (9) branch off to each control element (5).

3. A CVD reactor according to claim 2, characterized in that the control elements are valves which can be actuated outside telemetrically or by means of sliding contacts.

4. A CV D reactor according to claim 3, characterized in that the valves maintain their position without power.

5. A CVD reactor according to claim 4, characterized by a pressure controller (10) associated with the common supply line (7) for keeping pressure in the common supply line (7) constant.

6. A CVD reactor according to claim 2, characterized by the supply lines (9, 12) and the control elements (5) are disposed in the form of a star with respect to an axis of rotation (Z) of the carrier (6).

7. A CVD reactor according to claim 2, characterized in that the carrier (6) comprises a hollow shaft (31), which accommodates a core (13) that is fixed to a housing and provides the common supply line (7).

8. A CVD reactor according to claim 7, characterized in that the hollow shaft (31) is rotationally mounted in a bearing cavity of a bearing housing (20) fixedly connected to a reactor housing (11).

9. A CVD reactor according to claim 8, characterized in that the gas distribution volume (8) is an annular chamber disposed between the core (13) and the hollow shaft (31).

10. A CVD reactor according to claim 1, wherein the temperature measuring device 4 is disposed so that the surface temperatures of a number of rotary tables (2), disposed substantially in the form of a ring around a center of rotation (Z) of the susceptor (1), are measured one after the other in order to vary the gas flows to the associated gas cushions (3) correspondingly one after the other.

11. A CVD reactor according to claim 1, characterized in that the carrier (6) is disposed substantially in an interior of a reactor housing (11).

12. A CVD reactor according to claim 11, characterized in that a portion of the carrier (6) that carries the valves is disposed outside the reactor housing (11).

* * * * *